(12) United States Patent
Kondou et al.

(10) Patent No.: US 8,105,710 B2
(45) Date of Patent: Jan. 31, 2012

(54) BATTERY WITH LEADS

(75) Inventors: Masao Kondou, Moriguchi (JP); Yasuo Akai, Moriguchi (JP); Yoshihisa Ikeda, Moriguchi (JP); Tomoyuki Shose, Moriguchi (JP)

(73) Assignees: SANYO Electric Co., Ltd, Moriguchi-shi (JP); SANYO Energy Tottori Co., Ltd., Moriguchi-shi (JP)

( * ) Notice: Subject to any disclaimer, the term of this patent is extended or adjusted under 35 U.S.C. 154(b) by 758 days.

(21) Appl. No.: 12/096,668

(22) PCT Filed: Dec. 14, 2006

(86) PCT No.: PCT/JP2006/324950
§ 371 (c)(1),
(2), (4) Date: Jun. 9, 2008

(87) PCT Pub. No.: WO2007/069690
PCT Pub. Date: Jun. 21, 2007

(65) Prior Publication Data
US 2009/0291329 A1     Nov. 26, 2009

(30) Foreign Application Priority Data

Dec. 14, 2005   (JP) ................................ 2005-360413

(51) Int. Cl.
*H01M 6/12*   (2006.01)
*H01M 2/00*   (2006.01)
*H01M 2/02*   (2006.01)
*H01M 2/04*   (2006.01)

(52) U.S. Cl. ......... 429/162; 429/163; 429/164; 429/176
(58) Field of Classification Search .......... 429/162–164, 429/176
See application file for complete search history.

(56) References Cited

U.S. PATENT DOCUMENTS

| | | | |
|---|---|---|---|
| 6,676,440 B1 * | 1/2004 | Inamine et al. | 439/500 |
| 2004/0058249 A1 * | 3/2004 | Cai et al. | 429/248 |
| 2004/0166409 A1 * | 8/2004 | Takada et al. | 429/218.1 |
| 2004/0224224 A1 | 11/2004 | Watanabe et al. | |

FOREIGN PATENT DOCUMENTS

| | | |
|---|---|---|
| JP | 2002-298804 A | 10/2002 |
| JP | 2003-272587 A | 9/2003 |
| JP | 2004-327201 A | 11/2004 |

OTHER PUBLICATIONS

International Search Report of PCT/JP2006/324950, date of mailing Feb. 6, 2007.

* cited by examiner

*Primary Examiner* — Karie O'Neill Apicella
(74) *Attorney, Agent, or Firm* — Westerman, Hattori, Daniels & Adrian, LLP

(57) ABSTRACT

A battery 10A with leads has a low-profile external casing acting 11 as one of a pair of electrode terminals and a closure plate 12 acting as the other of the electrode terminals. The closure plate 12 hermetically seals an opening of the external casing 11 via an insulating gasket. A pair of lead plates 13 and 14 are each welded to a different one of the electrode terminals 11 and 12. One of the lead plates 13 and 14 is secured to a circuit board X. The lead plate 14 that is secured to the circuit board has a net-like structure.

6 Claims, 7 Drawing Sheets

FIG. 4

| Assembly Type | Circuit Board | Occurrence of Lead Plate Detachment | Occurrence of Short |
|---|---|---|---|
| a | X | 0/10 Samples | 0/10 Samples |
| b | Y | 0/10 Samples | 0/10 Samples |
| c | Z | 4/10 Samples | 5/10 Samples |

FIG. 5

| Assembly Type | Mesh Number | Soldering Strength |
|---|---|---|
| a | 200 | 150 |
| c |  | 100 |
| x | 50 | 60 |
| y | 400 | 120 |

BATTERY WITH LEADS

TECHNICAL FIELD

The present invention relates to batteries used as main and backup power sources of various electronic appliances. More specifically, the present invention relates to a battery with a pair of leads one of which is welded to a low-profile external casing and the other to a closure plate hermetically sealing an opening of the casing via an insulating gasket. The external casing acts as one of a pair of electrode terminals, whereas the closure plate acts as the other electrode terminal.

BACKGROUND ART

Lithium secondary batteries are small and light weight and have high energy-density and excellent storage characteristics. For these advantages, lithium secondary batteries have been widely used as main and backup power sources of various electronic appliances. In general, a lithium secondary battery used to power an electronic appliance has the shape of a coin or cylinder and mounted directly on a circuit board, such as a printed circuit board. In order to mount a lithium secondary battery onto a circuit board, one or more metal lead plates are secured at a first end portion to one or more of the electrode terminals of the lithium secondary battery by spot welding or laser welding. In addition, a second end portion of each lead plate is secured to the circuit board by soldering, after the second end portion is inserted into a terminal hole provided through the circuit board or placed onto the circuit board. (Note that the terms "lead" and "lead plate" are interchangeably used in this specification.)

One common process employed to reduce the cost of mounting electronic components onto a circuit board is reflow soldering, which is a process of placing electronic components on a surface of a circuit board and attaching the electronic components to the circuit board by reflowing solder paste. Typically, the solder reflowing process includes coating a surface of the circuit board with solder cream, positioning electronic components onto the solder cream coating, and applying heat by transporting the entire circuit board into a conveyorized reflow furnace to melt the solder cream. Taking advantage of the above process, the reflow soldering is also used to automatically solder a second end portion of a metal lead plate to a circuit board, after a first end portion of the metal lead plate has been attached to an end face of an electrode.

In order to realize such soldering, solder cream is applied to appropriate surface areas of a circuit board and the second end portion of each lead plate is positioned onto the solder cream coatings. Thereafter, the lithium secondary battery and the circuit board are transported into a reflow furnace where heat of 230° C.-270° C. is applied for a short period of time to melt the solder cream. When the molten solder solidifies, the lithium secondary battery is securely joined to the circuit board.

Unfortunately, however, the following problems should be noted. FIGS. 6A and 6B show a coin battery 20X to which leads have been soldered to the circuit board by the reflow soldering described above. As shown in the figures, a coin battery 10 has an anode cap 12 acting as one of the electrode terminals and a cathode can 11 acting as the other electrode terminal. A lead plate 21 is welded at a first end portion to the anode cap 12, whereas a lead plate 22 is welded at a first end portion to the cathode can 11. The second end portions of the lead plates 21 and 22 constitute soldering potions 21a and 22a. Through melting of solder cream coatings 21b and 22b applied to conductive portions U1 and U2 of a circuit board U, the soldering portions 21a and 22b are joined to the circuit board U. As a result, the coin battery 20X with leads is mounted on the circuit board U.

The problem is, as shown in FIG. 6B, that the soldering potions 21a and 22a of the lead plates 21 and 22 project outwardly beyond the peripheral edge of the coin buttery 10. Because of the soldering portion 21a of the lead plate 21 and the soldering portion 22a of the lead plate 22, the mounting area of the coin battery 10 on the circuit board U inevitably increases. In order to more firmly bond the coin battery 10 to the circuit board U, the area of the soldering portions 21a and 22a need to be increased even further, which results in increase of the mounting area even further.

Patent Document 1 (JP 2002-298804-A) suggests the following coin batteries each provided with leads, without increasing the area of soldering portions. FIG. 7A shows a coin battery 20Y to which leads have been attached according to Patent Document 1. As shown in the figure, the coin battery 10 has the cathode can 11 acting as one of the electrode terminals and the anode cap 12 acting as the other electrode terminal. A first end portion of a lead plate 23 is welded to the cathode can 11. A second end portion of the lead plate 23 is soldered to a circuit board V by melting a solder cream coating 23b applied to a conductive portion V1 of the circuit board V. The anode cap 12, however, is soldered to the circuit board V directly without any lead plate, by melting a solder cream coating 24 applied to a conductive portion V2 of the circuit board V.

FIG. 7B shows another coin battery 20Z to which leads have been attached according to Patent Document 1. As shown in the figure, a coin battery 10 has the cathode can 11 acting as one of the electrode terminals. A first end portion of a lead plate 25 is welded to the cathode can 11. The lead plate 25 is bent so that a second end portion thereof does not project outwardly beyond the peripheral edge of the cathode can 11. The second end portion of the lead plate 25 is soldered to a circuit board W by melting a solder cream coating 25b applied to a conductive portion W1 of the circuit board W. In addition, the anode cap 12 doubling as the other electrode of the coin battery 10 is soldered directly to the circuit board W without any lead plate, by melting a solder cream coating 26 applied to a conductive portion W2 of the circuit board W. With this arrangement, the coin battery 10 is mounted to the circuit board W without increasing the mounting area too much.

Patent Document 1: JP 2002-298804

DISCLOSURE OF THE INVENTION

Problems the Invention is Attempting to Solve

However, since it is human beings that use and carry around mobile phones, there is a risk that a mobile phone is dropped by mistake to receive vibration or shock. In the case of a mobile phone installed with a battery that is mounted to a circuit board, such vibration or shock may cause accidental detachment of the battery from the circuit board. In order to reduce or eliminate the risk, the strength of soldering between the circuit board and the battery needs to be increased. Indeed, a larger soldering area ensures that the battery is more securely attached to the conductive portion of the circuit board. Unfortunately, however, the soldering area cannot be increased without limit because of restrictions imposed on the size of mounting area.

The present invention is made in view of the above problems and aims to provide a battery with leads soldered to a circuit board with an increased strength even if the size of soldering area is limited. With this structure, the resulting battery with leads is less prone to accidental detachment from the circuit board when receiving vibration or shock.

Means for Solving the Problems

To achieve the above aim, the present invention provides a battery with a pair of lead plates one of which is secured to a circuit board. The battery includes: a low-profile external casing having an opening and acting as one of a pair of electrode terminals; a closure plate acting as the other of the electrode terminals; an insulating gasket via which the closure plate hermetically seals the opening of the external casing; and the pair of lead plates each welded to a different one of the electrode terminals. At least one of the lead plates secured to the circuit board has a net-like structure and is positioned entirely within a surface of the electrode terminal to which said at least one lead plate is welded.

As stated above, at least one of the lead plates is welded to an electrode terminal in such a manner that the lead plate is entirely covered by a surface of the electrode terminal facing toward the lead plate that is welded thereto. This structure ensures that the mounting area of the battery required for soldering is reduced without compromising the soldering strength. In addition, since at least one of the lead plates has a net-like structure, the actual surface area of the lead plate in contact with solder increases. Owing to the increased contact area, the soldering strength between the battery and the circuit board increases even if the mounting area is limited. As a consequence, a battery with leads according to the present invention is less prone to accidental detachment of the battery from the circuit board upon vibration or shock.

Here each lead plate having a net-like structure may be made of a wire mesh plate, a punching metal plate, an expanded metal plate, a metal lath sheet, an embossed plate, a cast grid plate, or a foam material plate. Each lead plate having a net-like structure may be coated with solder or with metal having an affinity for solder. Each lead plate having a net-like structure may be made of wire mesh of nickel-plated metal.

In the case where the lead plate is made of wire mesh, wire mesh with a mesh count of less than 100 is not suitable because the openings are too large to secure sufficient number of welding points between the anode and anode lead plate or between the cathode and the cathode lead plate. As a result, the soldering strength decreases. Yet, wire mesh with a mesh count of over 300 is not suitable either. Since openings of such wire mesh are too small, molten solder flashes out from the anode lead plate (or the cathode lead plate) at the time of soldering. Solder flashed out from the lead plate causes electrical shorting with the anode (or cathode). In view of this, each lead plate having a net-like structure may be wire mesh with a mesh count falling within a range of 100-300.

Effects of the Invention

A battery according to the present invention has a lead plate that is made of a net-like material, so that the soldering strength is increased without increasing the mounting area of the battery to the circuit board. Such a battery is extremely advantageous for downsizing electronic appliances.

BRIEF DESCRIPTION OF THE DRAWINGS

FIG. 4 is a table showing results of an impact test;

FIG. 5 is a table showing measurement results of load (tensile force);

REFERENCE NUMERALS

10: Coin-Type Lithium Secondary Battery
10A, 10B, 10C, 20X, 20Y: Coin-Type Lithium Secondary Battery with Leads
11: Cathode Can
12: Anode Cap
13, 16, 17, 22, 23, 25: Cathode Lead Plate
14, 15, 18, 21: Anode Lead Plate
13b, 14a, 14b, 15b, 16a, 18a, 17b, 21b, 22b, 23b, 24, 25b, 26: Solder Cream Coating
13a, 15a, 17a, 21a, 22a: Soldering Portion
X, Y, Z, V, W: Circuit Board
X1, X2, Y1, Y2, Z1, Z2, V1, V2, W1, W2: Conductive Portion

BEST MODE FOR CARRYING OUT THE INVENTION

Figure 1A:
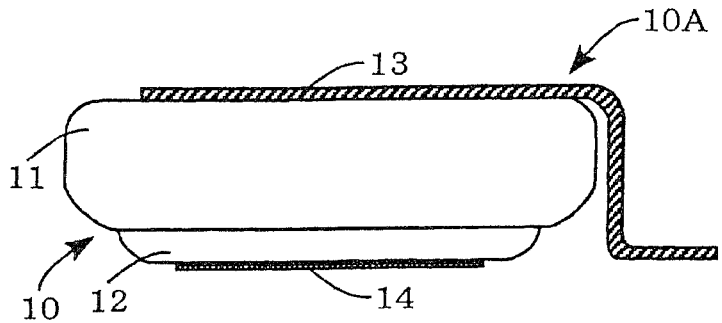
FIG. 1 are views schematically showing a coin-type lithium secondary battery according to Example 1 of the present invention.
Figure 1B:
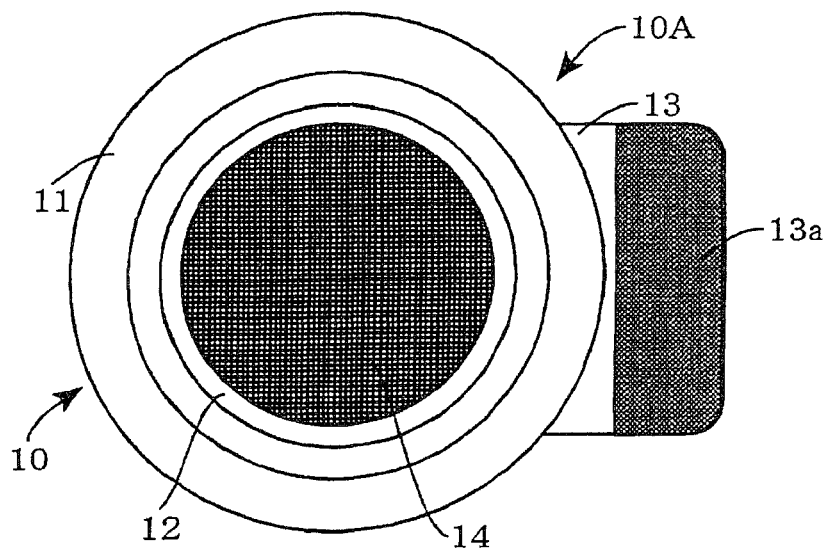
Figure 1C:
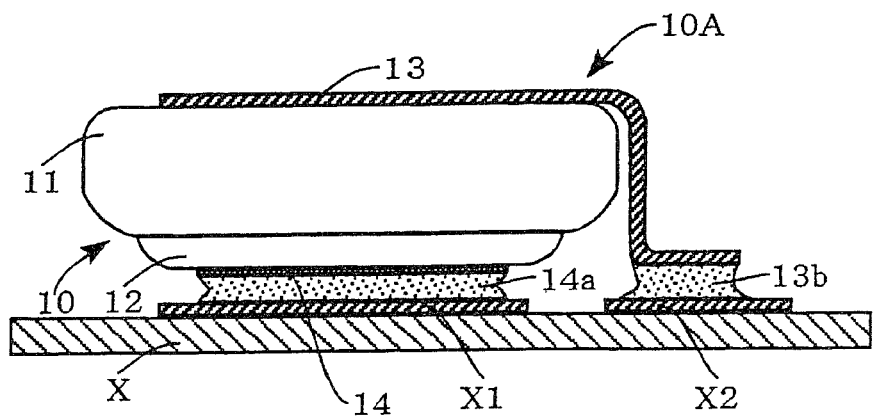
Figure 2A:
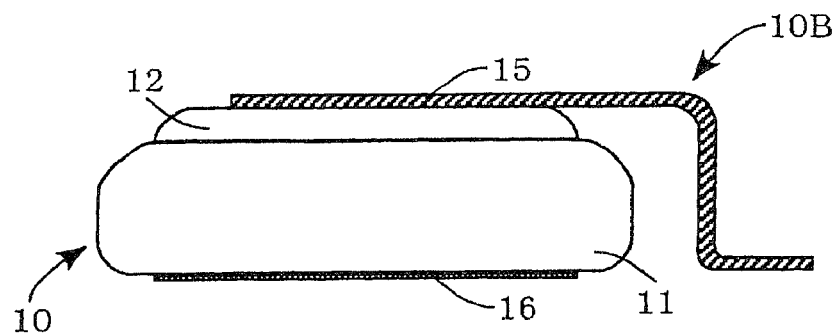
FIG. 2 are views schematically showing a coin-type lithium secondary battery according to Example 2 of the present invention.
Figure 2B:
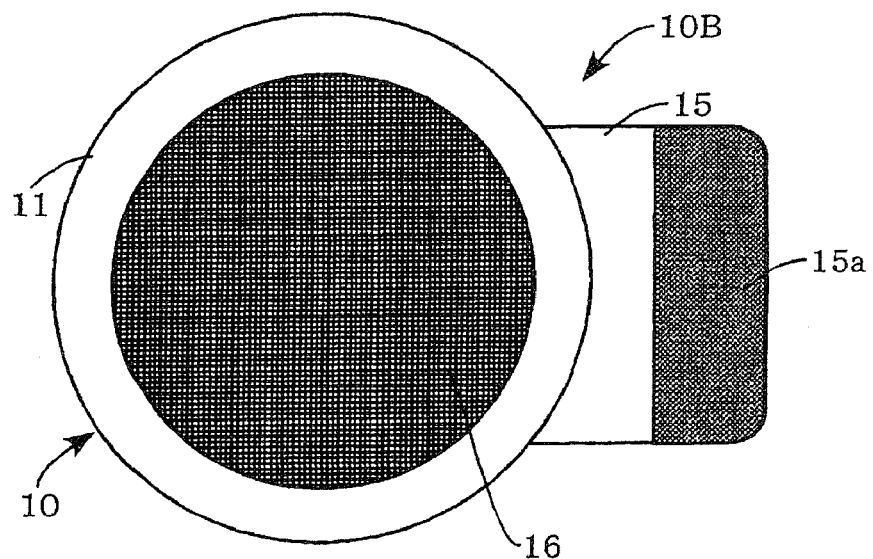

The following describes a battery according to one embodiment of the present invention with reference to FIGS. 1 and 2. It should be naturally appreciated, however, that the present invention is not limited to the following embodiment and various modifications may be made without departing from the gist of the present invention.

1. Coin-Type Lithium Secondary Battery

A coin-type lithium secondary battery 10 is manufactured as follows. As shown in FIG. 1, a cathode can (external can) 11 is made of stainless steel and has a low-profile (i.e., flat) shape. The cathode can 11 is filled with pellets of cathode active material mainly composed of manganese dioxide, along with a separator (neither is illustrated). An anode cap (closure plate) 12 is made of stainless steel and filled with lithium as anode active material (not illustrated). An electrolyte solution is then injected into the cathode can 11 and the anode cap 12 is placed to hermetically seal the battery 10 via an insulating gasket. The resulting lithium secondary battery 10 may be a 414-size coin battery that measures 4.8 mm in diameter and 1.4 mm in thickness. The electrolyte solution may be prepared by dissolving lithium trifluoromethanesulfonate ($LiCF_3SO_3$), which is an electrolyte, in a 1:1 mixed solvent of propylene carbonate (PC) and dimethoxyethane (DME), each of which is a nonaqueous solvent. $LiCF_3SO_3$ is dissolved in the mixed solvent at the concentration of 1 mol per liter.

2. Coin-Type Lithium Secondary Battery with Leads (1) Example 1

As Example 1 of the coin-type lithium secondary battery 10 described above, a coin-type lithium secondary battery 10A is manufactured. As shown in FIG. 1, a cathode lead plate 13 is secured to the outer surface of the cathode can 11, and an anode lead plate 14 is secured to the outer surface of the anode cap 12 both by spot welding or laser welding.

The cathode lead plate 13 is composed of a stainless plate of a substantially rectangular shape. A portion of the plate that would extend beyond the peripheral edge of the coin-type lithium secondary battery 10 is bent to be parallel with the side wall of the cathode can 11. The parallel portion of the plate is bent again to be horizontal at a height substantially equal to the height of the battery 10. The rear surface of the horizontally extending end portion of the plate constitutes a soldering portion 13a.

The anode lead plate 14 welded to the outer surface of the anode cap 12 is composed of stainless plain-woven wire mesh with a mesh count of 200. The lead plate 14 is circular that is slightly smaller in outside diameter than the bottom of the anode cap 12. The anode lead plate 14 is not limited to stainless plain-woven wire mesh, and any other materials including a perforated metal plate, an embossed plate, an expanded metal plate, a metal lath sheet, and a foam metal plate may be used.

To mount the coin-type lithium secondary battery 10A of Example 1 manufactured as above onto a circuit board X, solder cream coatings 14a and 13b are applied to conductive layers X1 and X2 of the circuit board X, as shown in FIG. 1C. Then, the coin-type lithium secondary battery 10A is so disposed on the circuit board X that the anode lead plate 14 is positioned on the solder cream coating 14a and that the soldering portion 13a of the cathode plate 13 is positioned on the solder cream coating 13b. With this disposition, the lithium secondary battery 10A and the circuit board X are transported into a reflow furnace to briefly apply heat of 230° C.-270° C. By the brief heating, the solder cream coatings 14a and 13b melt and then solidify to attach the lithium secondary battery 10A to the circuit board X.

(2) Example 2

As Example 2 of the coin-type lithium secondary battery 10 described above, a coin-type lithium secondary battery 10B is manufactured. As shown in FIG. 2, an anode lead plate 15 is secured to the outer surface of the anode cap 12, and a cathode lead plate 16 is secured to the outer surface of the cathode can 11 both by spot welding or laser welding. The anode lead plate 15 is composed of a stainless plate of a substantially rectangular shape. A portion of the plate that would extend beyond the peripheral edge of the coin-type lithium secondary battery 10 is bent to be parallel with the side wall of the cathode can 11. The parallel portion of the plate is bent again to be horizontal at a height substantially equal to the height of the battery 10. The rear surface of the horizontally extending end portion of the plate constitutes a soldering portion 15a. The cathode lead plate 16 welded to the outer surface of the cathode can 11 is composed of stainless plain-woven wire mesh with a mesh count of 200. The cathode lead plate 16 is circular that is slightly smaller in outside diameter than the bottom of the cathode can 11.

Similarly to the anode lead plate 14 of Example 1 described above, the cathode lead plate 16 is not limited to stainless plain-woven wire mesh and any other materials including a perforated metal plate, an embossed plate, an expanded metal plate, a metal lath sheet, and a foam metal plate may be used.

Figure 2C:
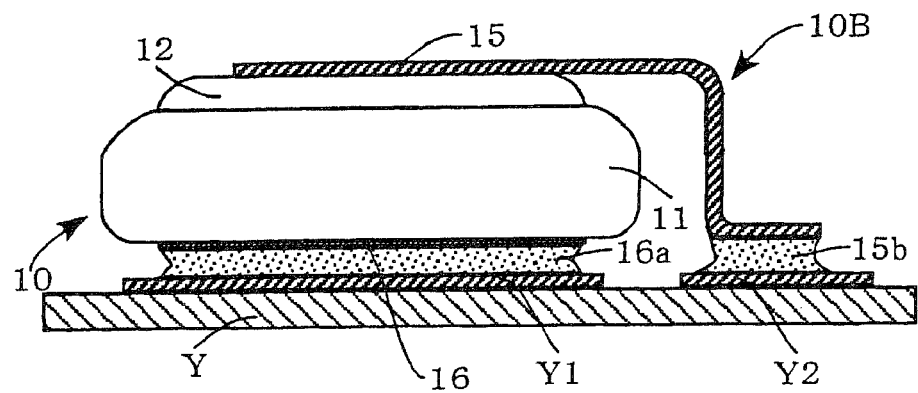

To mount the coin-type lithium secondary battery 10B of Example 2 manufactured as above onto a circuit board Y, solder cream coatings 16a and 15b are applied to conductive layers Y1 and Y2 of the circuit board Y, as shown in FIG. 2C. Then, the coin-type lithium secondary battery 10B is so disposed on the circuit board Y that the cathode lead plate 16 is positioned on the solder cream coating 16a and that the soldering portion 15a of the anode lead plate 15 is positioned on the solder cream coating 15b. With this disposition, the coin-type lithium secondary battery 10B and the circuit board Y are transported into a reflow furnace to briefly apply heat of 230° C.-270° C. By the brief heating, the solder cream coatings 16a and 15b melt and then solidify to attach the lithium secondary battery 10B to the circuit board Y.

(3) Comparative Example 1

Figure 3A:
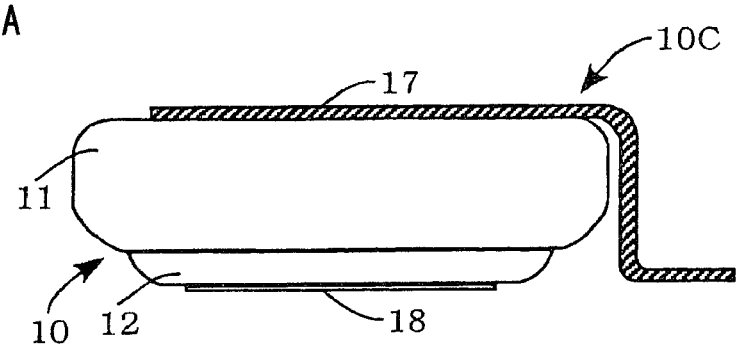
FIG. 3 are views schematically showing a coin-type lithium secondary battery according to Comparative Example 1.
Figure 3B:
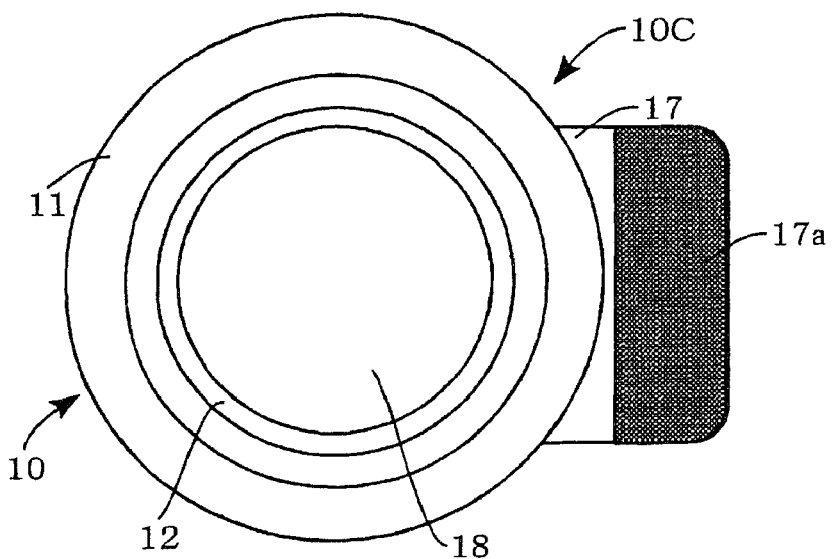

As Comparative Example 1 of the coin-type lithium secondary battery 10 described above, a coin-type lithium secondary battery 10C is manufactured. As shown in FIG. 3, a cathode lead plate 17 is secured to the outer surface of the cathode can 11 and an anode lead plate 18 is secured to the outer surface of the anode cap 12 both by spot welding or laser welding.

The cathode lead plate 17 is composed of a stainless plate of a substantially rectangular shape. A portion of the plate that would extend beyond the peripheral edge of the coin-type lithium secondary battery 10 is bent to be parallel with the side wall of the cathode can 11. The parallel portion of the plate is bent again to be horizontal at a height substantially equal to the height of the battery 10. The rear surface of the horizontally extending end portion of the plate constitutes a soldering portion 17a. The anode lead plate 18 welded to the outer surface of the anode cap 12 is composed of a stainless plate of a circular shape that is slightly smaller in outside diameter than the bottom of the anode cap 12.

Figure 3C:
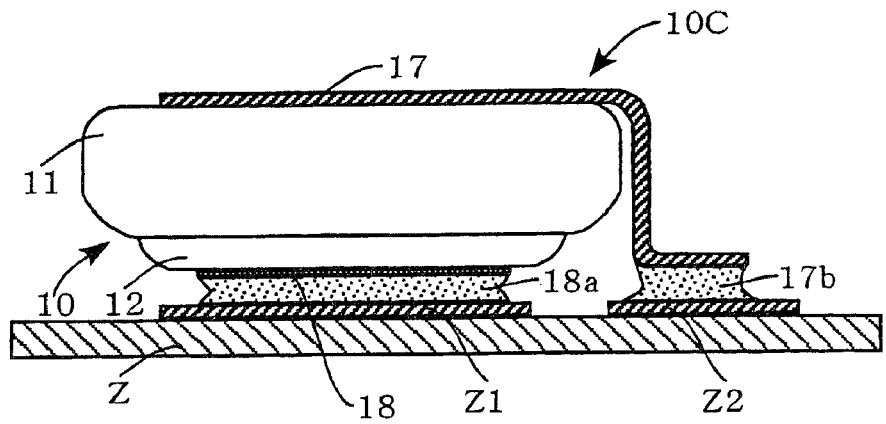
Figure 6A:
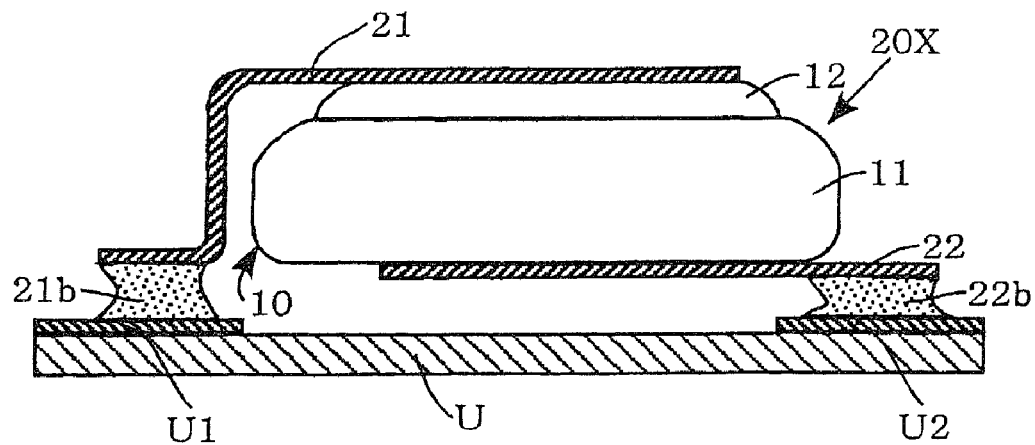
FIG. 6 are views schematically showing a coin-type lithium secondary battery according to a conventional example 1.
Figure 6B:
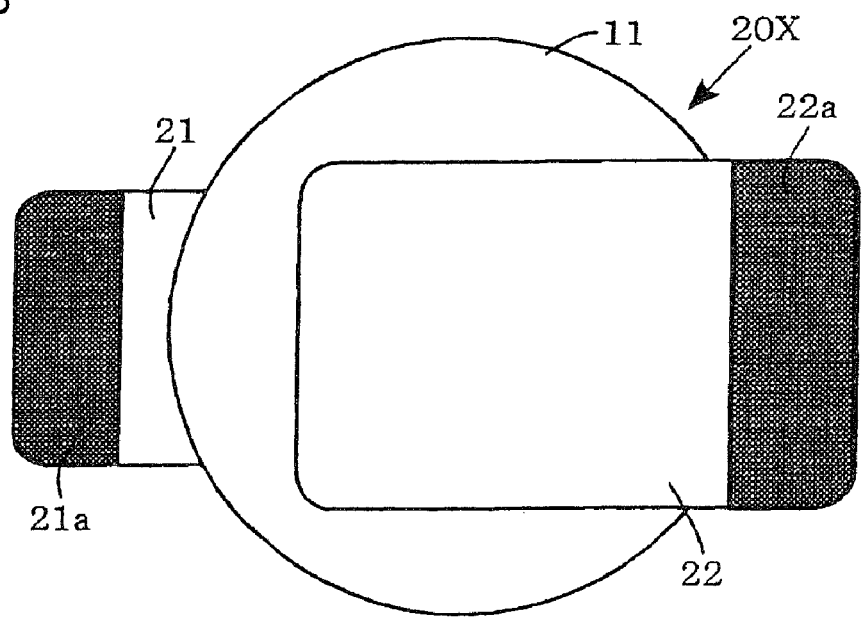
Figure 7A:
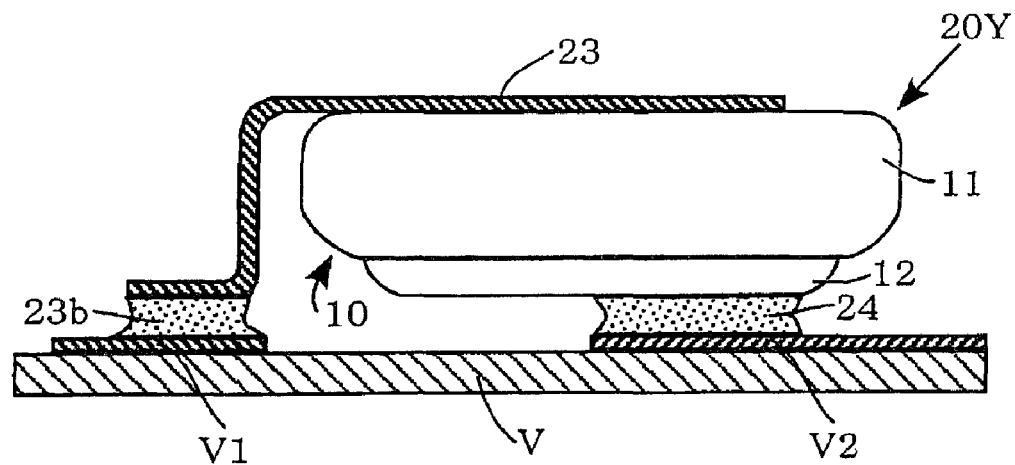
FIG. 7 are views schematically showing a coin-type lithium secondary battery according to a conventional example 2.
Figure 7B:
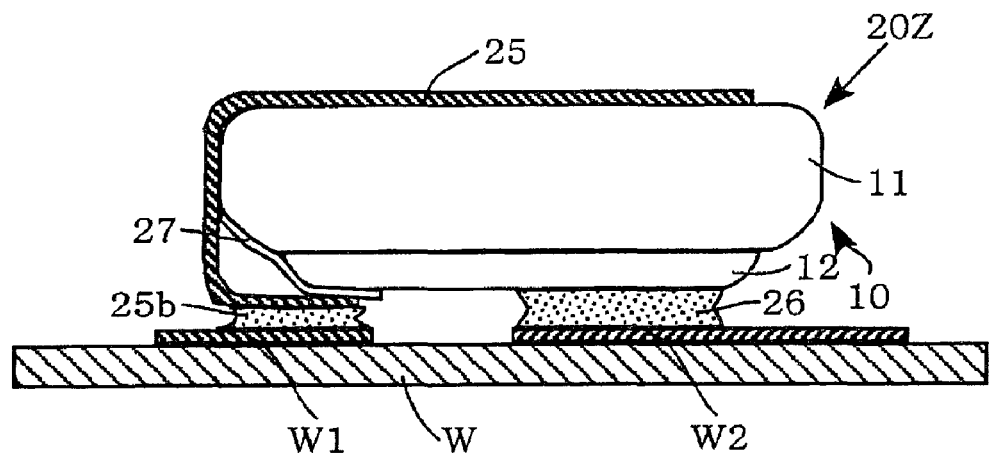

To mount the coin-type lithium secondary battery 10C according to Comparative Example 1 manufactured as above onto a circuit board Z, solder cream coatings 18a and 17b are applied to conductive layers Z1 and Z2 of the circuit board Z, as shown in FIG. 3C. Then, the coin-type lithium secondary battery 10C is so disposed on the circuit board Z that the anode lead plate 18 is positioned on the solder cream coating 18a and that the soldering portion 17a of the cathode plate 17 is positioned on the solder cream coating 17b. With this disposition, the coin-type lithium secondary battery 10C and the circuit board Z are transported into a reflow furnace to briefly apply heat of 230° C.-270° C. By the brief heating, the solder cream coatings 18a and 17b melt and then solidify to attach the lithium secondary battery 10C to the circuit board Z.

3. Impact Test

An impact test was conducted on the coin-type lithium secondary batteries 10A, 10B, and 10C mounted on the circuit boards X, Y, and Z, respectively to compare the soldering strength. To conduct the test, assemblies a, b, c were prepared. The assembly a was prepared to include the coin-type lithium secondary battery 10 according to Example 1 having the anode lead plate 14 welded at one main surface to the anode cap 12. The other main surface of the anode plate 14 was secured to the conductive portion X1 of the circuit board X by melting the solder cream coating 14a. The assembly b was prepared to include the coin-type lithium secondary battery 10 according to Example 2 having the cathode lead plate 16 welded at one main surface to the cathode can 11. The other main surface of the cathode lead plate 16 was secured to the conductive portion Y1 of the circuit board Y by melting the solder cream coating 16a. The assembly C was prepared to include the coin-type lithium secondary battery 10 according to Comparative Example 1 having the anode lead plate 18 welded at one main surface to the anode cap 12. The other surface of the anode lead plate 18 was secured to the conductive portion of the circuit board Z by melting the solder cream coating 18a.

Ten of each assemblies a, b, and c were prepared. Each assembly was dropped from a height of 1.8 m three times in a direction longitudinally of the circuit board and another three times in a direction laterally of the circuit board. Each assembly was then checked for occurrence of lead plate detachment and electrical shorting. FIG. 4 shows the result of the impact test.

As apparent from FIG. 4, the assemblies c (each having the circuit board Z) experienced more occurrences of lead plate detachment and electrical shorting. This is believed to be due to the following reason. Since the anode lead plate 18 of each assembly c is made of a stainless plate, the solder cream coating 18a in the molten state at the time of reflowing flashes out from the anode lead plate 18, which results in reduction of the soldering strength. As a result, the anode lead plate 18 is more easily detached from the conductive portion Z1 of the circuit board Z. In addition, the solder flashed out from the anode lead plate 18 adheres to the cathode can 11 and causes electrical shorting.

On the other hand, the assemblies a (each having the circuit board X) and the assemblies b (each having the circuit board Y) are free from occurrences of lead plate detachment and electrical shorting. This is believed to be due to the following reason. The anode lead plate 14 of each assembly a has a net-like structure (stainless wire mesh). Similarly, the cathode lead plate 16 of each assembly b has a net-like structure (stainless wire mesh). This net-like structure allows, at the time of reflowing, the solder cream coatings 14a and 16a in the molten state to flow into the openings of the mesh. That is, the molten solder is kept within the surface of the lead plates 14 and 16 without flashing out. This serves to prevent occurrences of lead plate detachment and electrical shorting.

According to the above embodiment, the battery of Example 1 is provided with the anode lead plate 14 having a net-like structure (stainless mesh) and the battery of Example 2 is provided with the cathode lead plate 16 having a net-like structure (stainless mesh). It should be noted, however, that the battery of Example 1 may be provided with the cathode lead plate 13 also having a net-like structure. Similarly, the battery of Example 2 may be provided with the anode lead plate 15 that is also has a net-like structure. Such a modification further enchases the soldering strength between the circuit board X (Y) with the coin-type lithium secondary battery 10A (10B). In view of the above, it is suitable to provide a net-like structure to the cathode lead plate 13 and the anode lead plate 15.

4. Mesh Count of Lead Plate

Wire Mesh

As described above, the anode lead plate 14 of Example 1 and the cathode lead plate 16 of Example 2 are both made of stainless mesh with a mesh count of 200. The following analyzes suitable mesh counts of stainless mesh used as lead plates. For the purpose of analysis, an anode lead plate 14x was prepared from a stainless wire mesh with the mesh count of 50, and an anode lead plate 14y was prepared from stainless wire mesh with the mesh count of 400. The anode lead plate 14x was then welded to the anode cap 12 of the coin-type lithium secondary battery 10 to prepare an assembly x. Similarly, the anode lead plate 14y was welded to the anode cap 12 of the coin-type lithium secondary battery 10 to prepare an assembly y.

The assemblies a, c, x, and y were prepared in the above-described manner to measure the load (tensile force) causing detachment of the circuit board X from the coin-type lithium secondary battery 10. In the measurement, a push-pull gauge was used. FIG. 5 shows the measurement results expressed relatively to the load (tensile force) taken as 100.

As apparent from the measurement results shown in FIG. 5, the assembly x having the anode lead plate 14x with the mesh count 50 is lower in soldering strength than the other assemblies a, c, and y. This is believed to be due to the following reason. In the case of wire mesh with the mesh count of 50, the openings are relatively large, so that relatively fewer weld joints are produced between the anode lead plate 14x and the anode cap 12 at the time of welding. This results in insufficient weldability. On the other hand, the assembly y having the anode lead plate 14y with the mesh count 400 is superior in weld strength than the assembly x. However, since the openings of the wire mesh are relatively small, there is a risk of flashing out of solder from the anode lead plate 14y, which causes electrical shorting with the cathode can (cathode terminal) 11.

The assembly a having the anode lead plate 14 with the mesh count 200 is superior in weld strength than the other assemblies c, x, and y. As long as the mesh count is 100 or larger, the openings are not too large, so that a sufficient number of weld joints are produced between the anode cap 12 and the anode lead plate 14. As a result, the weld strength between the anode cap 12 and the anode lead plate 14 improves. In addition, as long as the mesh count is 300 or smaller, the openings are not too small, so that flashing out of solder from the anode lead plate 14 is avoided. In view of the above, the preferable mesh count for the lead plates (the anode lead plate 14 or the cathode lead plate 16) falls within the range of 100 and 300. In the case where the anode lead plate 14 and/or the cathode lead plate 16 are made of wire mesh with a mesh count falling within the range of 100 and 300, it is preferable to coat the surface of the wire mesh with metal having affinity for solder to make more intimate contact therebetween.

INDUSTRIAL APPLICABILITY

The present invention applicable to a battery used as a main or backup power source of various electronics appliance. More specifically, the present invention is suitably applicable a battery with a pair of leads one of which is welded to a low-profile external casing and the other to a closure plate. The external casing doubles as one of a pair of electrode terminals, and the closure plate doubles as the other electrode terminal and hermetically seals an opening of the external casing via an insulating gasket.

The invention claimed is:
1. A battery with a pair of leads one of which is secured to a circuit board, comprising:
 a low-profile external casing having an opening and acting as one of a pair of electrode terminals;
 a closure plate acting as the other of the electrode terminals;
 an insulating gasket via which the closure plate hermetically seals the opening of the external casing; and
 the pair of lead plates each welded to a different one of the electrode terminals, wherein at least one of the lead plates secured to the circuit board has a net-like structure and is positioned entirely within a surface of the electrode terminal to which said at least one lead plate is welded.

2. The battery according to claim 1, wherein each lead plate having a net-like structure is made of a wire mesh plate, a punching metal plate, an expanded metal plate, a metal lath sheet, an embossed plate, a cast grid plate, or a foam material plate.

3. The battery according to claim 1, wherein each lead plate having a net-like structure is coated with solder or with metal having an affinity for solder.

4. The battery according to claim 2, wherein each lead plate having a net-like structure is coated with solder or with metal having an affinity for solder.

5. The battery according to claim 1, wherein each lead plate having a net-like structure is made of wire mesh of nickel-plated metal.

6. The battery according to claim 1, wherein each lead plate having a net-like structure is wire mesh with a mesh count falling within a range of 100-300.

* * * * *